(12) United States Patent
Feldman et al.

(10) Patent No.: US 7,740,508 B2
(45) Date of Patent: Jun. 22, 2010

(54) PROBE BLOCK ASSEMBLY

(75) Inventors: Steven Feldman, Cedar Park, TX (US); Joseph N. Castiglione, Cedar Park, TX (US); Abhay R. Joshi, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 12/206,565

(22) Filed: Sep. 8, 2008

(65) Prior Publication Data

US 2010/0062629 A1 Mar. 11, 2010

(51) Int. Cl.
H01R 13/24 (2006.01)
(52) U.S. Cl. ..................... 439/700; 324/761
(58) Field of Classification Search ............... 439/700; 324/761
See application file for complete search history.

(56) References Cited

U.S. PATENT DOCUMENTS

| | | | |
|---|---|---|---|
| 4,734,046 A | 3/1988 | McAllister et al. | |
| 5,485,140 A * | 1/1996 | Bussin | 340/436 |
| 6,447,328 B1 | 9/2002 | Feldman | |
| 6,498,506 B1 * | 12/2002 | Beckous | 324/761 |
| 6,551,126 B1 * | 4/2003 | Feldman | 439/482 |
| 6,824,427 B1 | 11/2004 | Feldman et al. | |
| 6,902,416 B2 * | 6/2005 | Feldman | 439/219 |
| 2005/0007128 A1 | 1/2005 | Beckous et al. | |
| 2005/0079772 A1 | 4/2005 | DeLessert | |
| 2007/0197095 A1 | 8/2007 | Feldman et al. | |

* cited by examiner

Primary Examiner—Truc T Nguyen
(74) Attorney, Agent, or Firm—Dean M. Harts; Melanie G. Gover (57) ABSTRACT

A probe block assembly includes a block and a cable terminated to a coaxial connector that is configured to electrically communicate with a plurality of probes inserted in the block. The coaxial connector includes a connector signal contact configured to separably connect to a first probe that is insertable into an aperture of the block and insulated from the block, and a resilient ground beam configured to commonly ground one or more second probes inserted in the block.

18 Claims, 7 Drawing Sheets

Fig. 10 ctor assembly illustrated in FIG. 1.

PROBE BLOCK ASSEMBLY

BACKGROUND

Probe blocks are employed to evaluate integrated circuits or other electronic equipment and include probes that provide contact interfaces between an automated test equipment test head and the integrated circuits or electronic equipment undergoing evaluation. Some probe blocks include spring-loaded probes that provide temporary spring contact interfaces between the test head and the integrated circuits, and are referred to as spring probe blocks.

Probe blocks of the type used in automatic test equipment are typically machined from metal bar stock in an elaborate and costly sequence of processes that precisely locate bores and other features of the block. The probes are press-fitted into the bores, for example with an arbor press, with about 20 pounds of force. Occasionally, one or more of the probes will be damaged, for example as the test head moves relative to the electronic equipment undergoing evaluation. Replacement of damaged probes can be costly and time consuming since the damaged probe must be extracted or pressed out of the bore that it was pressed into.

For probe blocks in general, one probe is provided for each signal line, and one or more probes are provided as reference or ground for each signal line. During use, at least some of the probes invariably necessitate some level of maintenance, or even replacement. Maintenance and/or replacement of the probes usually require access to an arbor press or other probe-extraction device.

Improved probe blocks that are less costly and easier to maintain compared to the known probe blocks would be welcomed by those who test circuits with automated test equipment.

SUMMARY

One aspect provides a probe block assembly including a block and a cable terminated to a coaxial connector that is configured to electrically communicate with a plurality of probes inserted in the block. The coaxial connector includes a connector signal contact configured to separably connect to a first probe that is insertable into an aperture of the block and insulated from the block, and a resilient ground beam configured to commonly ground one or more second probes inserted in the block.

BRIEF DESCRIPTION OF THE DRAWINGS

The accompanying drawings are included to provide a further understanding of embodiments of the invention and are incorporated in and constitute a part of this specification. The drawings illustrate embodiments of the invention and together with the description serve to explain principles of the various embodiments. Other embodiments of the invention and many of the intended advantages of the embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments of the invention provide a coaxial connector assembly configured to removably attach to a block, where the coaxial connector assembly includes a connector that is configured to separably connect to a first probe and a resilient ground beam that is configured to commonly ground one or more other probes inserted into the block. The coaxial connector assembly is configured to latch to the block and to easily and conveniently detach from the block through the use of a simple hand tool. When the coaxial connector assembly is latched in place, the resilient ground beam contacts either the block or probes inserted into the block to commonly ground the ground probes inserted in the block.

At least some embodiments of the coaxial connector assembly provide a stamped sheet metal ground shield that is inexpensive to accurately produce and configured to be field replaceable. The probes that are inserted into the coaxial connector assembly are also field-replaceable. In one embodiment, the block includes an electrically conductive ground plate that is mated to an electrically insulating housing. At least some embodiments of the block provide for field replaceable components (e.g., ground plates, ground probe receptacles, and ground probes), which will be useful to the field service technicians servicing these probe block assemblies.

Figure 1:
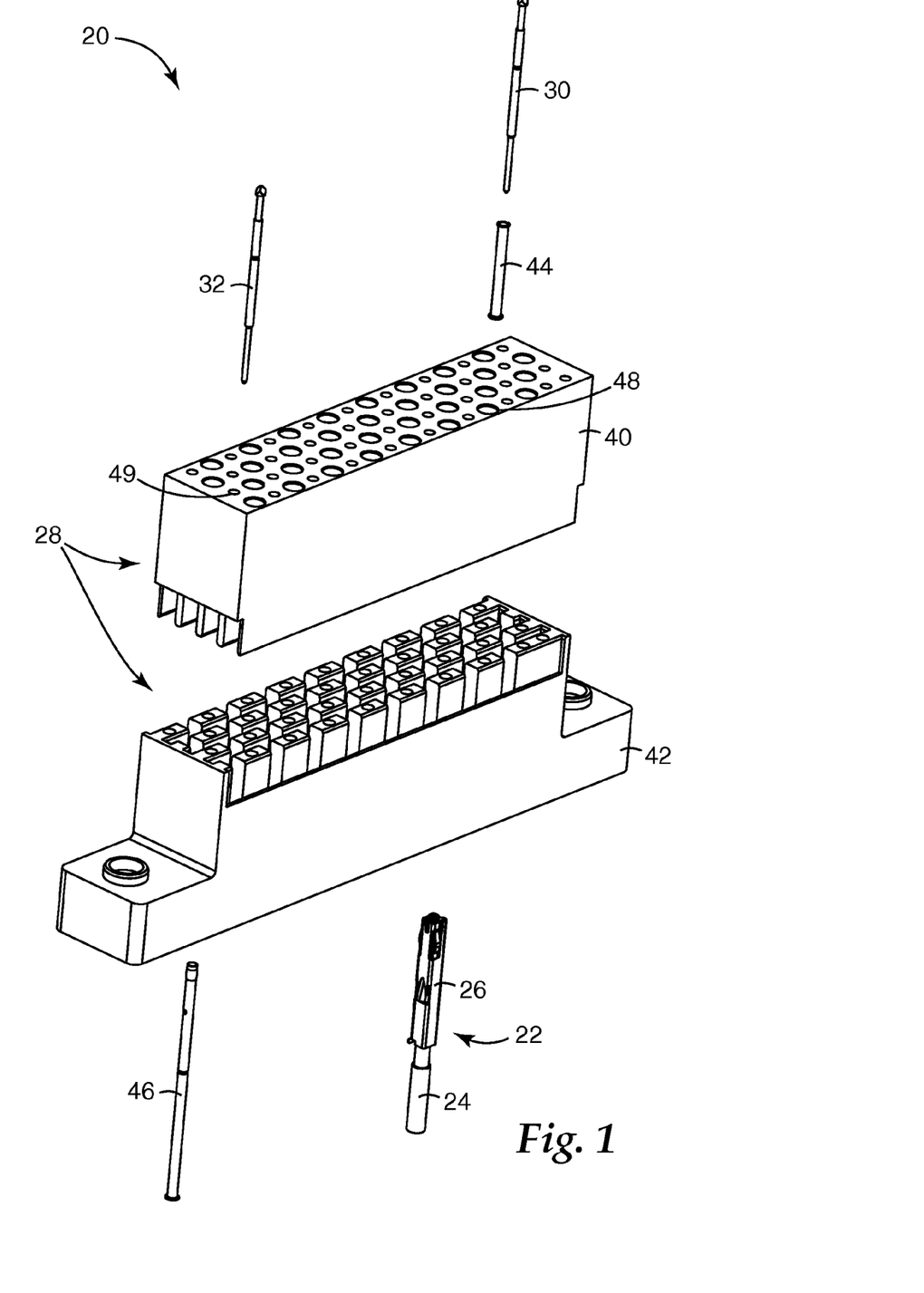
FIG. 1 is an exploded perspective view of a probe block assembly including a coaxial connector assembly insertable into a block according to one embodiment.

FIG. 1 is an exploded perspective view of a probe block assembly 20 according to one embodiment. Probe block assembly 20 includes a coaxial connector assembly 22 having a coaxial cable 24 terminated to a coaxial connector 26 that latches with a block 28 to electrically connect with a first probe 30 and commonly ground one or more second probes 32.

Block 28 includes monolithic metal blocks, monolithic electrically non-conducting blocks, or blocks having an electrically conductive portion coupled to an electrically non-conducting portion. In one embodiment block 28 includes an electrically conductive ground plate 40 that mates with an electrically insulating housing 42, where coaxial connector 26 is configured to latch with insulating housing 42 and electrically contact ground plate 40. In one embodiment, insulating housing 42 is configured to insulate the ground of ground plate 40 from the chassis ground of the automated test equipment system. In other embodiments, the automated test equipment touches the ground of a monolithic conductive block and a single ground is defined through the monolithic conductive block.

In one embodiment, first probe 30 is a signal probe that is electrically isolated from ground plate 40 by an insulator 44, and second probe 32 is a ground probe that is frictionally retained within a ground probe receptacle 46 that is press-fit through insulating housing 42 and ground plate 40. First probe 30 and insulator 44 are inserted in an aperture 48 formed in ground plate 40. In one embodiment, first probe 30 is a spring probe configured for manual (e.g., by hand) insertion and removal from coaxial connector 26. Coaxial connector 26 is configured to be retained within block 28 and removed from block 28 with a tool (for example, tool 100 in FIG. 6D). In general, spring probes usually contact pads or the annular rings of vias of Device Under Test boards (DUT boards) to which integrated circuits are removably attached.

In one embodiment, second probe 32 is a ground probe (or a ground spring probe) that is press-fit, interference fit, or otherwise disposed in ground probe receptacle 46, which is inserted in a bore 49 formed in ground plate 40. A trailing end of second probe 32 is disposed in a bore formed in insulating housing 42. In one embodiment, ground probe receptacle 46 is press-fit into block 28 to hold conductive ground plate 40 in a mated configuration against insulating housing 42, although other forms of ground plate 40 and insulating housing 42 are also acceptable. Ground probe receptacle 46 provides a level of compliance to probe block assembly 20 and is configured to minimize damage to second probe 32, because second probe 32 has a minimum of compliance. In other embodiments, second probe 32 is a ground probe provided in a "banana bend" configuration in which second probe 32 is frictionally fit into a bore formed in ground plate 40 and inserted into an oversized bore formed in insulating housing 42. In one embodiment, second probe 32 is a spring probe.

In one embodiment, first probe 30 is suitably provided as a signal probe, a power probe, or a utility probe. For example, in one embodiment first probe 30 is provided as a signal spring probe that is electrically isolated from conductive ground plate 40 by insulator 44 and electrically connected to coaxial connector assembly 22 to communicate electrical signals through coaxial cable 24. In another embodiment, first probe 30 is a power probe and power is run through a signal line of the coaxial connector assembly 22 to provide power to first probe 30. In another embodiment, first probe 30 is provided as a utility probe.

Figure 2:
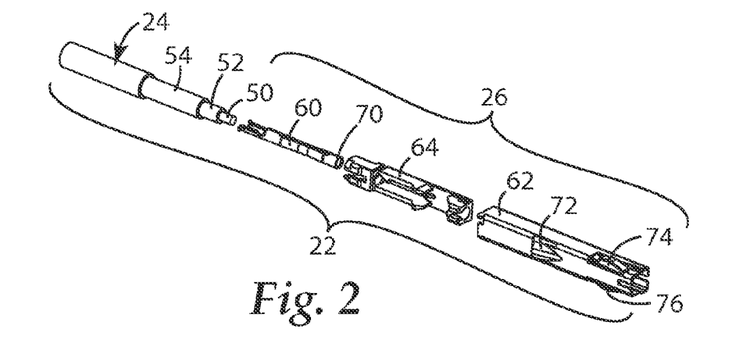
FIG. 2 is an exploded perspective view of the coaxial connector assembly illustrated in FIG. 1.

FIG. 2 is an exploded perspective view of coaxial connector assembly 22 including coaxial cable 24 terminated to coaxial connector 26. Coaxial cable 24 includes a center conductor 50, a dielectric 52 disposed around center conductor 50, and a shield 54 electrically separated from center conductor 50 by dielectric 52. In one embodiment, coaxial connector 26 includes a contact 60 electrically isolated from a shield body 62 by an insulator 64. Contact 60 includes an end 70 that is configured to receive first probe 30 (FIG. 1) when coaxial connector assembly is attached to block 28. When assembled, shield body 62 is disposed around insulator 64 which is disposed around contact 60, center conductor 50 of coaxial cable 24 connects to contact 60, and shield 54 connects with shield body 62 to terminate coaxial cable 24 to coaxial connector 26. When assembled, all ground probes are ultimately commonly grounded to shield 54. Suitable coaxial connectors 26 are described in U.S. Pub. No. 20070197095, filed Jan. 25, 2007 at least in paragraphs [0041] to [0044] and FIGS. 6-9F, which description is incorporated herein.

In one embodiment, insulator 64 is a "skeletonized" insulator that includes first and second spaced apart insulative members (i.e., insulated ends) that are maintained in the spaced apart relationship by one or more insulating spacer bars. Suitable such skeletonized dielectric insulators are described in U.S. Pub. No. 20070197095, filed Jan. 25, 2007, in at least at paragraph [0042] and FIG. 6. Other suitable insulators are also acceptable, including substantially solid dielectric insulators formed to include an axial bore sized to receive contact 60.

In one embodiment, shield body 62 includes a latch 72, a first resilient ground beam 74, and a second opposing resilient ground beam 76. With reference to FIG. 1, latch 72 flexes and is configured to removably couple coaxial connector assembly 22 with insulating housing 42. Resilient ground beams 74, 76 are configured to electrically contact ground plate 40 and commonly ground the second probes 32 that are inserted into block 28. Shield body 62 is fabricated, for example, by stamping sheet metal to form latch 72 and resilient ground beams 74, 76. In this regard, shield body 62 is relatively inexpensive to fabricate as compared to the known ground shields that are typically formed by deep drawing metal into tubular cylinders.

Figure 3:
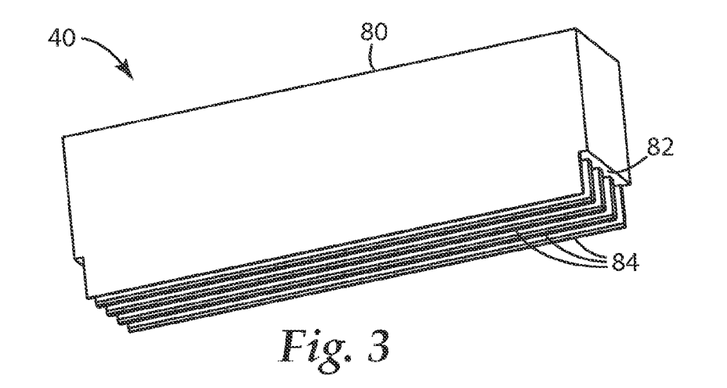
FIG. 3 is a perspective view of a ground plate of the block illustrated in FIG. 1.

FIG. 3 is a perspective view of ground plate 40. Ground plate 40 includes a probe side 80 opposite a connector side 82 and a series of spaced apart plates 84 extending away from connector side 82. The apertures 48 and bores 49 illustrated in FIG. 1 extend between probe side 80 and connector side 82 of ground plate 40. In one embodiment, ground plate 40 is fabricated from a block of metal to include the spaced apart plates 84. In this manner, referencing FIG. 1, the second probes 32 that are inserted into the bores 49 of ground plate 40 contact the metal block and the coaxial connector assemblies 22 inserted between plates 84 commonly ground the second probes 32.

Figure 4:
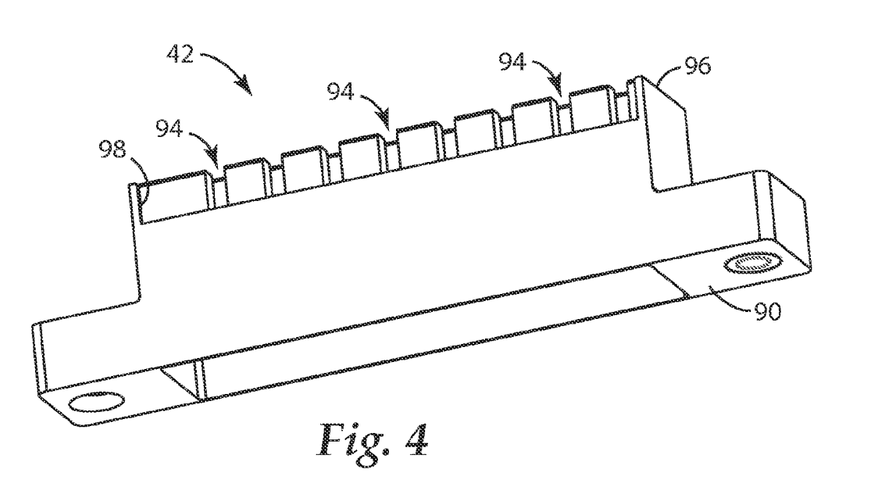
FIG. 4 is a perspective view of an insulating housing of the block illustrated in FIG. 1.

FIG. 4 is a perspective view of insulating housing 42. In one embodiment, insulating housing 42 includes a first side 90 having an opening that communicates with channels 94 formed in second side 96. Coaxial connector assembly 22 (FIG. 1) is generally inserted into insulating housing 42 into channel 94. Channel 94 is configured to retain coaxial connectors 26 such that resilient ground beams 74, 76 (FIG. 2) are oriented to contact at least one plate 84 (FIG. 3). In one embodiment, insulating housing 42 includes a recess 98 formed in opposing faces of insulating housing 42, where each recess 98 is sized to receive an outermost one of plates 84. The plates 84 of ground plate 40 align and intermesh with second side 96 of insulative housing 42 thereby mating ground plate 40 with insulating housing 42.

Figure 5:
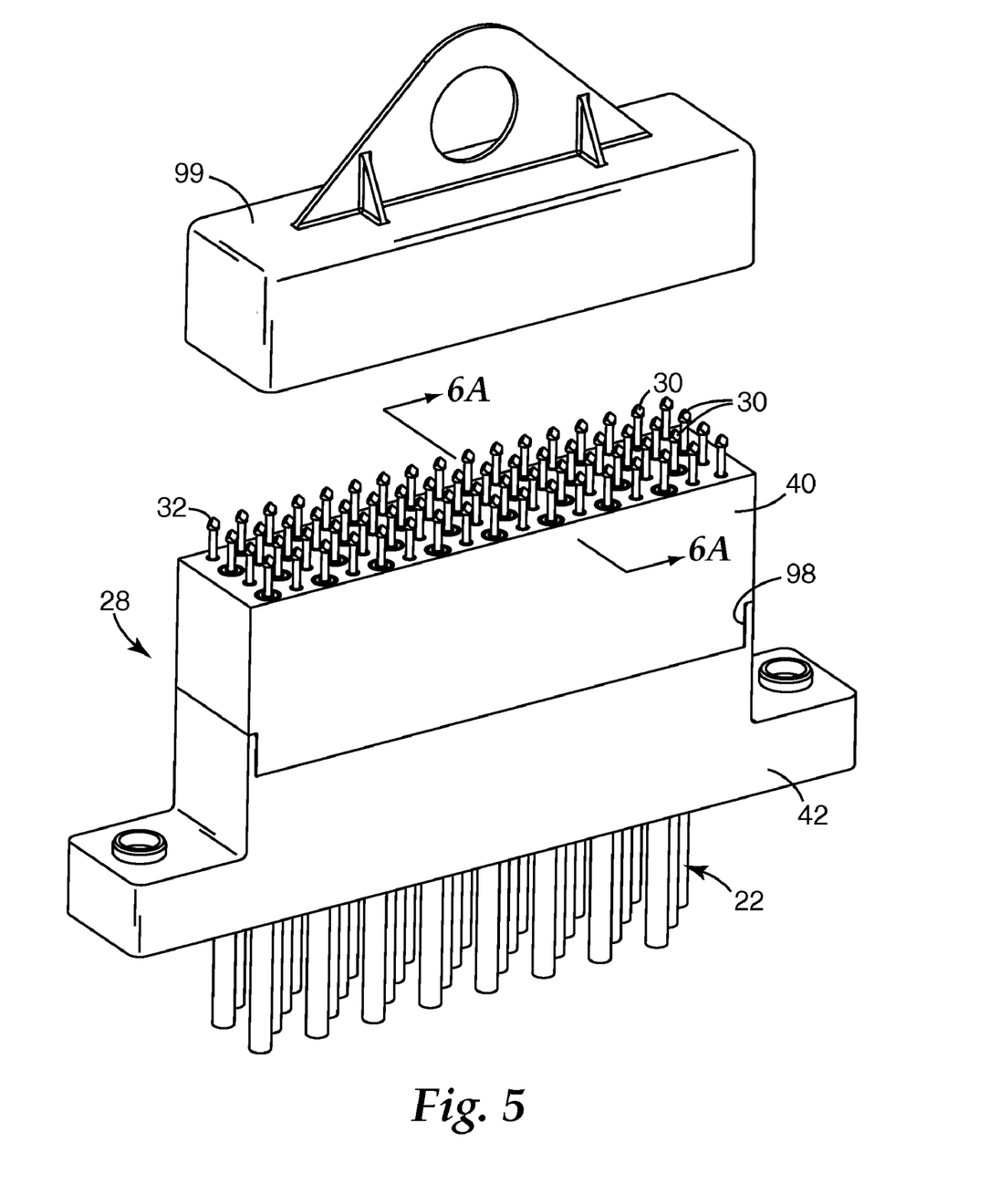
FIG. 5 is a perspective view of the probe block assembly illustrated in FIG. 1 as assembled.

FIG. 5 is a perspective view of probe block assembly 20 assembled and including an optional protective cover 99. Ground plate 40 is mated to insulative housing 42 along recess 98. Coaxial connector assembly 22 is inserted into block 28 for electrical connection with first probes 30 (e.g., signal probes). When fully inserted, latch 72 (FIG. 2) removably secures coaxial connector assembly 22 to insulative housing 42 and resilient ground beams 74, 76 (FIG. 2) contact ground plate 40 to common ground second probes 32 (e.g., ground probes).

Figures 6A, 6B:
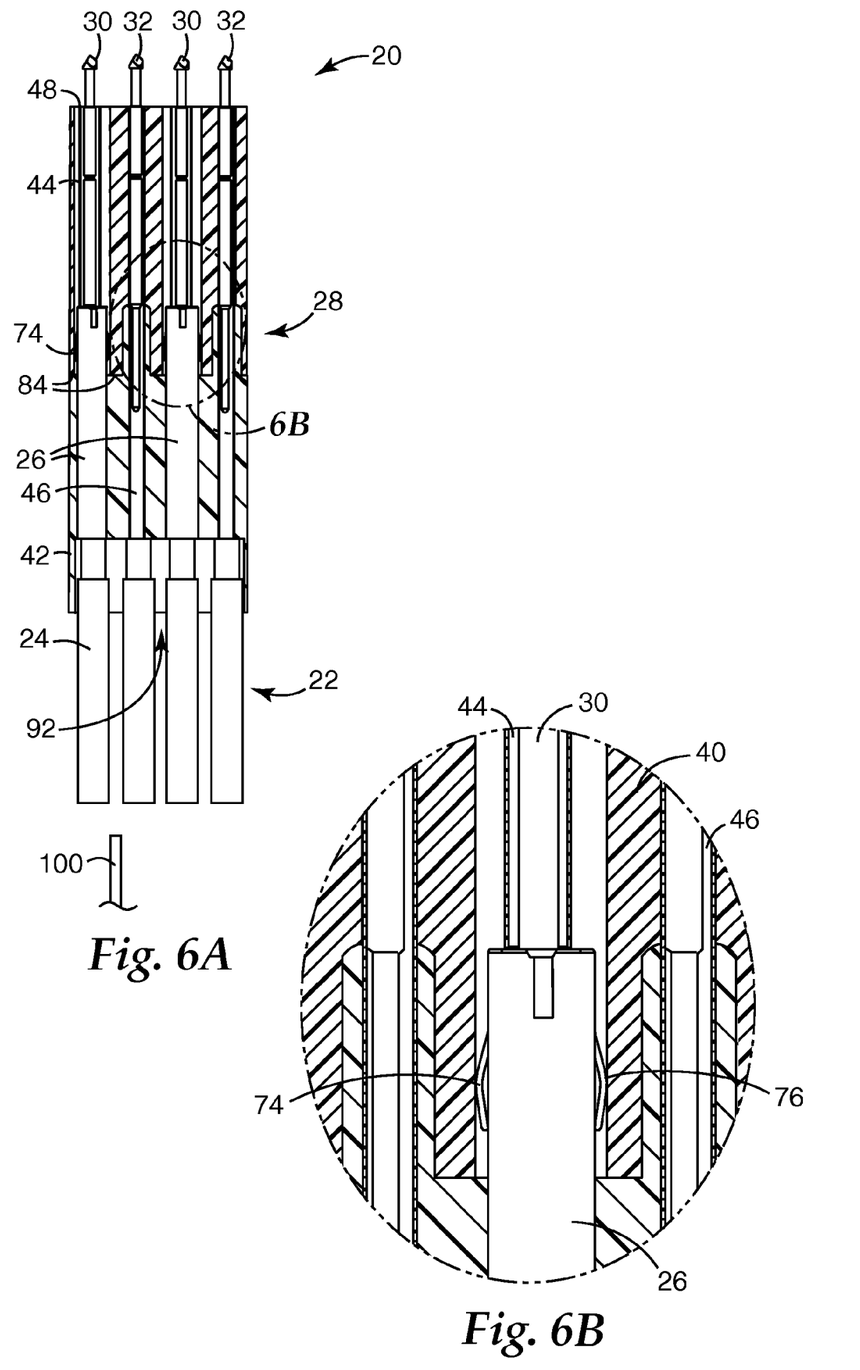
FIG. 6A is a schematic cross-sectional view of the assembled probe block assembly taken along line 6A-6A illustrated in FIG. 5.
FIG. 6B is an enlarged view of the coaxial connector assembly connected to the block.

FIG. 6A is a cross-sectional view of probe block assembly 20 taken along line 6A-6A of FIG. 5 and FIG. 6B is an enlarged view of resilient ground beams 74, 76 in contact with ground plate 40. Each coaxial cable 24 of coaxial connector assembly 22 connects with one of the first probes 30. Second probes 32 are inserted into ground probe receptacles 46, and in the view of FIG. 6A, the coaxial cables 24 that are aligned with second probes 32 are actually in the background and connected with first probes 30 that are behind the second probes 32.

Each first probe 30 is electrically isolated from ground plate 40 by insulator 44 and electrically connected with contact 60 (FIG. 2) for signal transmission through coaxial cable 24. Resilient ground beams 74, 76 of coaxial connector 26 contact ground plate 40 and commonly ground second probes 32 that are inserted into block 28. In particular, resilient ground beams 74, 76 resiliently flex inward toward coaxial connector 26 when coaxial connector 26 is inserted into ground plate 40 (such that only a small portion of resilient ground beams 74, 76 extend beyond shield body 62), and second probe 32 is press-fit into ground probe receptacle 46, which is press-fit into block 28. In this manner, all of the second probes 32 have the same ground potential and a ground path is created from the cable shield 54 through shield body 62 through resilient ground beams 74, 76, to the plates 84 of ground plate 40 to ground probe receptacle 46, and ultimately to second probe 32.

Impedance control is provided by selectively sizing the diameter of aperture 48 formed in ground plate 40, the diameter of first probe 30, and the effective dielectric constant of insulator 44. In one embodiment, the characteristic impedance provided by first probe 30, insulator 44, and the aperture 48 formed in ground plate 40 is substantially the same as the characteristic impedance of the coaxial connector assembly 22.

Figure 6C:
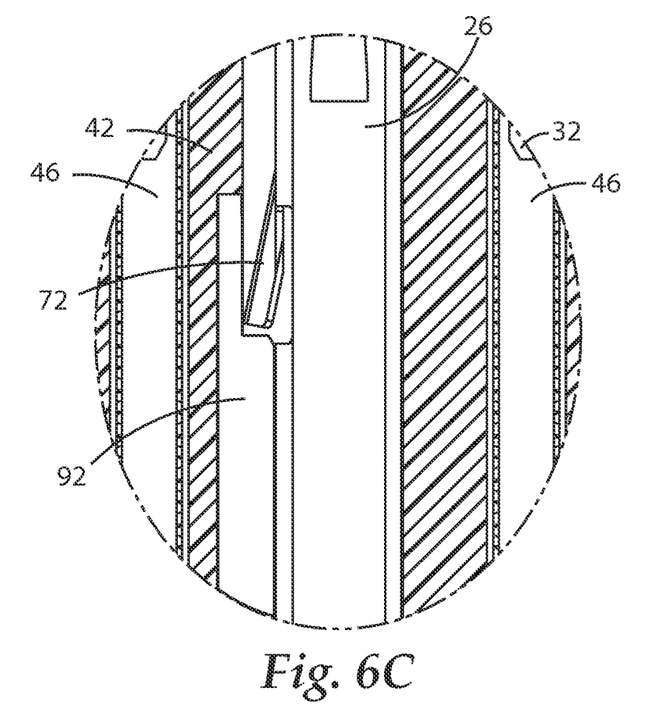
FIG. 6C is a schematic cross-sectional view of a portion of the assembled probe block assembly illustrated in FIG. 5.

FIG. 6C is an enlarged view of latch 72 engaged with insulating housing 42. The cross-sectional view of FIG. 6C is orthogonal to the view of FIG. 6B and is taken approximately area 6C indicated on FIG. 6A. Block 28 is assembled by mating ground plate 40 with insulating housing 42. Coaxial connector 26 is inserted into and retained within block 28 (FIG. 1) by engaging latch 72 with insulating housing 42, which enables resilient ground beams 74, 76 (FIG. 6B) to contact plates 84 (FIG. 6A) of ground plate 40 (FIG. 6B). Tool slot 92 allows for insertion of tool 100 (FIG. 6D) to disengage latch 92.

The known connectors for conventional probe block assemblies are generally press-fit into a backside of a metal block and connected to signal probes (e.g., spring probes) that are press-fit into a front side of the metal block. Occasionally, during use of the conventional probe block assembly, one or more of the probes would become damaged. The damaged probes have previously been replaced by removing the spring probe from the front side and pressing the damaged or defective connector out of the block (for example with an arbor press) before press-fitting an undamaged connector and spring probe back into the block. The removal and replacement of the known connectors and spring probes can potentially increase the wear imparted to the block, and possibly remove anti-oxidation coatings and the like applied to the block, which undesirably affects the electrical contact between the spring probe and the block.

Figure 6D:
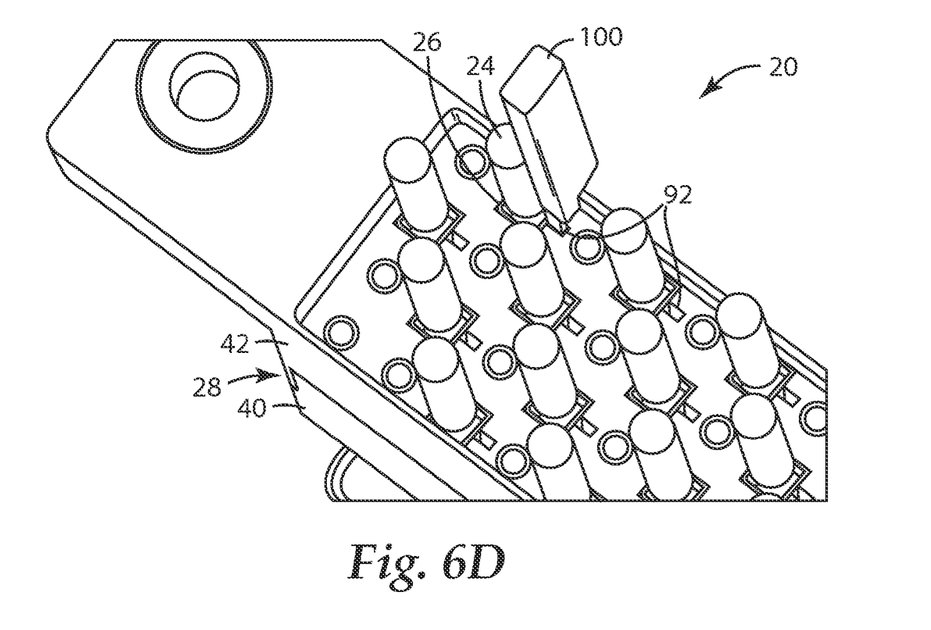
FIG. 6D is a perspective bottom view of the assembled probe block assembly illustrated in FIG. 5.

In contrast, the coaxial connector assembly 22 described above is removable from the block 28 by depressing latch 72, for example with tool 100, and pulling the coaxial connector 26 out of the block 28 by hand. The coaxial connector assembly 22 is thus field replaceable by service technicians, minimizes the expenses associated with arbor-pressing connectors out of probe assembly blocks, and minimizes wear imparted to the blocks.

Coaxial connector assembly 22 includes one or more resilient ground beam 74, 76 that are configured to commonly ground the ground probes of a probe block assembly in a wide range of useful implementations, some of which are illustrated below in FIGS. 7-9.

FIG. 6D is a bottom view of the assembled probe block assembly 20. In one embodiment, tool slot 92 is sized to receive a tool that is inserted into tool slot 92 to depress latch 72 on shield body 62 (FIG. 2), which enables removal and field replacement of coaxial connector assembly 22. In one embodiment, tool 100 is inserted into tool slot 92 from the direction of insulating housing 42 to depress latch 72 (FIG. 6C) for removal of coaxial connector 26 from block 28. In one embodiment, tool 100 is fabricated from plastic and includes a proximal end sized to be manipulated by a hand and a slender distal end sized to be inserted into tool slot 92. Other forms of tool 100 are also acceptable. Depressing latch 72 frees coaxial connector 26 from insulating housing 42 to provide quick and convenient removal of the entire coaxial connector assembly 22 from block 28.

Figure 7:
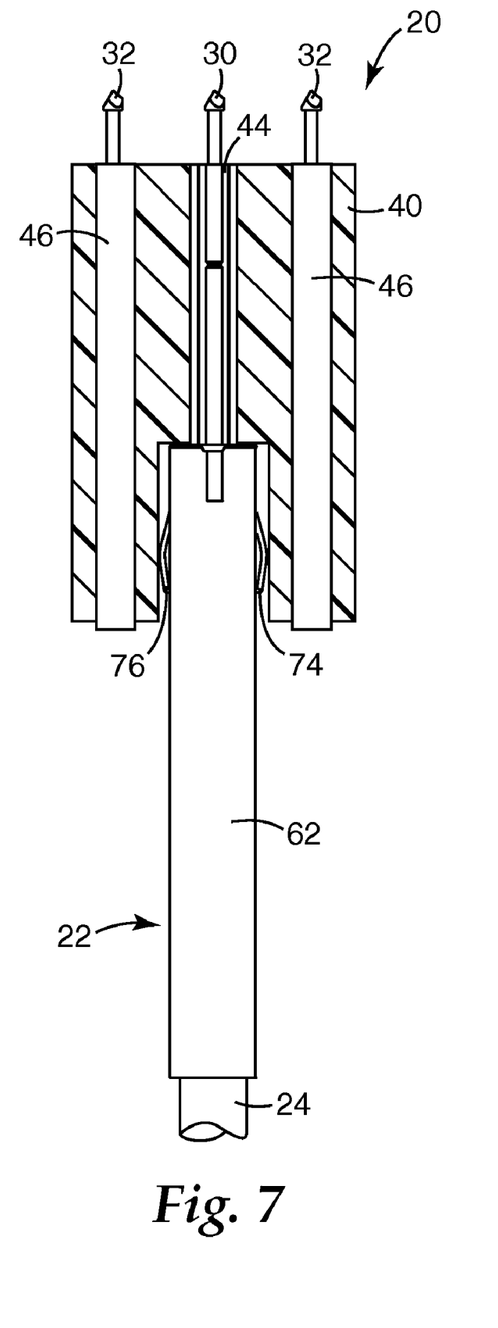
FIG. 7 is a cross-sectional view of a coaxial connector assembly contacting the block and commonly grounding one or more second probes inserted in the block according to one embodiment.

FIG. 7 is a cross-sectional a view of probe block assembly 20 employed to commonly ground the second probes 32 that are inserted into an electrically conductive block provided by ground plate 40. Coaxial connector assembly 22 is electrically connected to first probe 30, which is electrically isolated from ground plate 40 by insulator 44. Shield body 62 includes resilient ground beams 74, 76 that contact ground plate 40 in a manner that commonly grounds the second probes 32. In particular, the ground path provided in this configuration extends from shield body 62 through resilient ground beams 74, 76 and into ground plate 40, to the ground probe receptacles 46 which are press-fit into ground plate 40, and to the second probes 32 that are press-fit into the ground probe receptacles 46.

Figure 8:
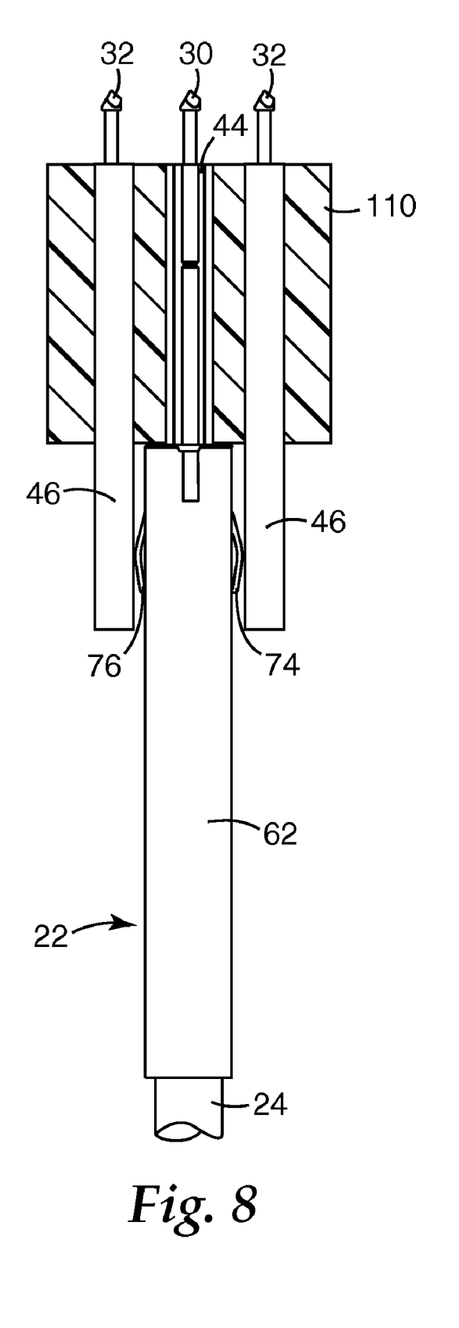
FIG. 8 is a cross-sectional view of a coaxial connector assembly contacting ground probe receptacles and commonly grounding the probes inserted into the ground probe receptacles according to another embodiment.

FIG. 8 is a cross-sectional view of coaxial connector assembly 22 configured to directly contact the ground probe receptacles 46 and commonly ground the second probes 32 retained in the ground probe receptacles 46. For example, in one embodiment coaxial connector assembly 22 is inserted between ground probe receptacles 46 and electrically connected to the first probe 30, and resilient ground beams 74, 76 contact ground probe receptacles 46 that are inserted into a monolithic block 110 to commonly ground the second probes 32. In one embodiment, monolithic block 110 is an electrically non-conducting block. In one embodiment, monolithic block 110 is an electrically conducting block.

Figure 9:
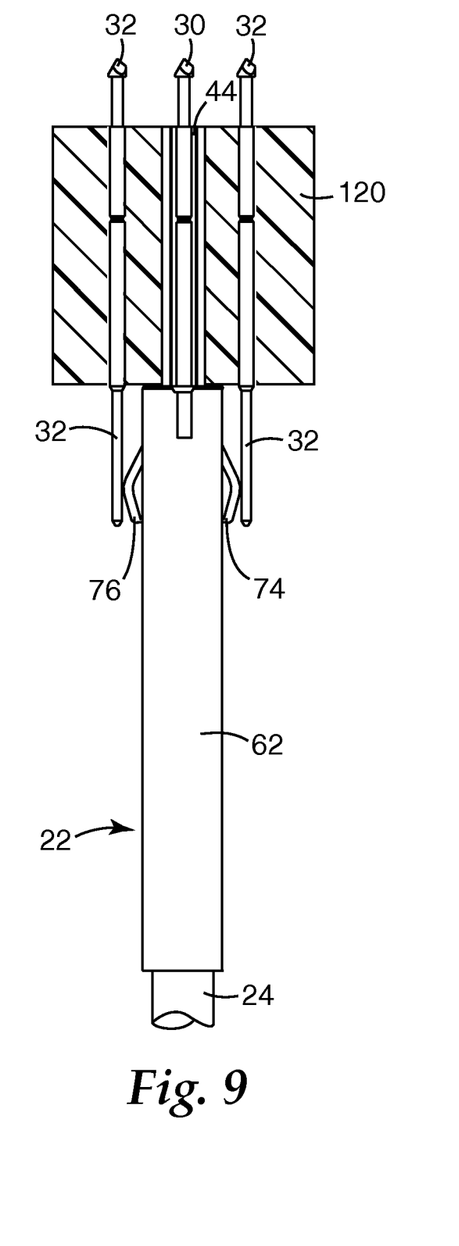
FIG. 9 is a cross-sectional view of a coaxial connector assembly contacting and commonly grounding ground probes that are inserted into the block according to another embodiment.

FIG. 9 is a cross-sectional view of coaxial connector assembly 22 commonly grounded directly to second probes 32. Second probes 32 are press-fit into a monolithic block 120, and coaxial connector assembly 22 is inserted between second probes 32 to electrically connect with first probe 30 in a manner that enables resilient ground beam 74, 76 to contact and commonly ground the second probes 32. In one embodiment, monolithic block 120 is an electrically non-conducting block. In one embodiment, monolithic block 120 is an electrically conducting block.

At least some embodiments described above provide coaxial connector assembly 22 having resilient and flexible ground beams that are configured to commonly ground a multiplicity of ground probes inserted into the block by contacting the conductive ground plate 40 (FIG. 7), or by contacting the ground probe receptacles 46 (FIG. 8), or by contacting one or more of the second probes 32 directly (FIG. 9).

Figure 10:
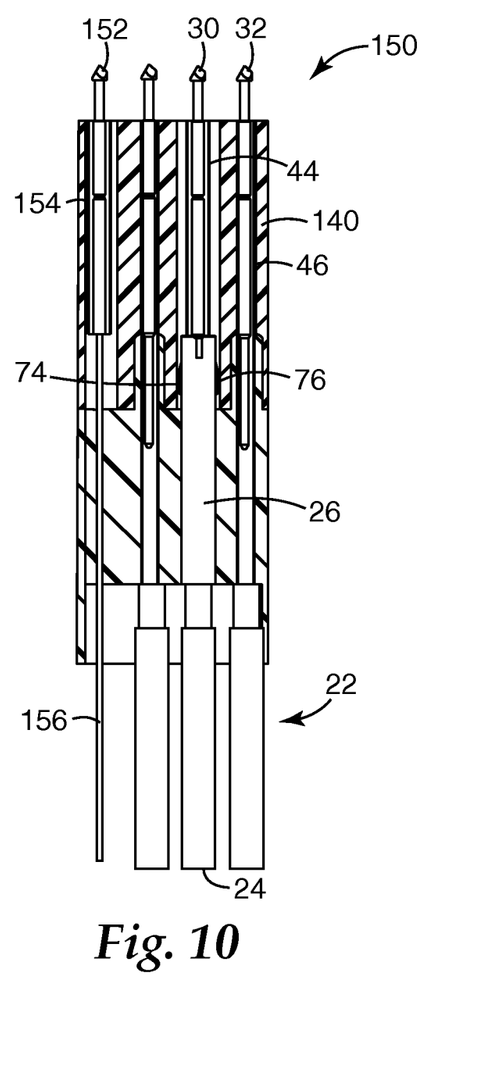
FIG. 10 is a cross-sectional view of a probe block assembly including a power probe inserted into a block and a coaxial connector assembly configured to commonly ground one or more other probes inserted in the block.

FIG. 10 is a cross-sectional view of a probe block assembly 150 according to another embodiment. Probe block assembly 150 includes the coaxial connector assembly 22 described above electrically connected to first probe 30 and commonly grounding a plurality of second probes 32 inserted into a block 140, and a power probe 152 isolated from block 140 by a dielectric 154 and connected to a power wire 156. First probe 30 is isolated from block 140 by insulator 44 and transmits signals through coaxial cable 24. Second probes 32 are press-fit into the ground probe receptacles 46 that are press-fit into electrical contact with block 140. Power probe 152 is configured to deliver power through power wire 156 to an electronic device (not shown) that is coupled to probe block assembly 150. In another embodiment, power probe 152 is replaced with a utility probe or other suitable probe, as dictated by the user environment.

Some embodiments include probe block assembly 150 provided with impedance control that results from selectively sizing the aperture in the block 140 that receives first probe 30, a diameter of first probe 30, and the effective dielectric constant of insulator 44.

In one embodiment, power probe 152 is isolated from block 140 by dielectric 154 and is electrically connected to one of the coaxial connector assemblies 22 where power is delivered through center conductor 50 of coaxial cable 24 (FIG. 2). That is to say, one embodiment provides the option of running power through the coaxial cable associated with the coaxial connector assembly 22.

Some embodiments provide a probe block assembly including a coaxial connector assembly configured for electrical connection with a first probe and provided with one or more resilient ground beams that are configured to commonly ground one or more second probes of the probe block assembly. Some embodiments provide convenient and field replaceable connector assemblies that provide controlled impedance or impedance matching for the components of the probe block assembly.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of probe block assemblies, as discussed herein. Therefore, it is intended that this invention be limited only by the claims and the equivalents thereof.

What is claimed is:

1. A probe block assembly comprising:
    a block comprising an electrically conductive ground plate that is mated to an electrically insulating housing; and
    a cable terminated to a coaxial connector that is configured to electrically communicate with a plurality of probes inserted in the block, the coaxial connector comprising:
    a connector signal contact configured to separably connect to a first probe, the first probe insertable into an aperture of the block and insulated from the block,
    a resilient ground beam configured to commonly ground one or more second probes inserted in the block.

2. The probe block assembly of claim 1, wherein the resilient ground beam is configured to contact the block and commonly ground one or more second probes inserted in the block.

3. The probe block assembly of claim 1, wherein the second probes each comprise a ground probe received within a receptacle that is press-fit into the block, and the resilient ground beam is configured to contact the receptacle and commonly ground each ground probe within each receptacle.

4. The probe block assembly of claim 1, wherein the second probes each comprise a ground probe and the resilient ground beam is configured to contact at least one of the ground probes to commonly ground the ground probes inserted in the block.

5. The probe block assembly of claim 1, wherein the coaxial connector comprises a shield body that comprises a latch and defines the resilient ground beam, the resilient ground beam configured to resiliently contact the ground plate and the latch configured to removably couple with the insulating housing in securing the coaxial connector to the block.

6. The probe block assembly of claim 5, wherein the electrically insulating housing defines a tool slot sized to receive a tool that is configured to depress the latch and enable removal of the coaxial connector from the block.

7. The probe block assembly of claim 1, wherein the second probes comprise ground probes that are inserted into receptacles, each receptacle press-fit into a bore extending through the ground plate and the electrically insulating housing and configured to secure the ground plate to the electrically insulating housing.

8. The probe block assembly of claim 1, wherein the second probes comprise ground probes, each ground probe is press-fit into a plate bore formed in the ground plate and interference fit into a housing bore formed in the electrically insulating housing that is aligned with the plate bore.

9. The probe block assembly of claim 1, wherein the first probe comprises a signal probe that is insertable into an electrical insulator disposed within the aperture of the block, with impedance control resulting from selectively sizing the aperture of the block, a diameter of the signal probe, and the effective dielectric constant of the electrical insulator.

10. A probe block assembly comprising:
    a conductive block defining an aperture extending between a probe side and a cable side of the block;
    a first probe inserted into the aperture and electrically isolated from the block and at least one ground probe extending from the probe side of the block;
    a coaxial connector assembly comprising a coaxial cable terminated to a connector that is insertable partway into the aperture for electrical connection with the first probe, the connector comprising a shield body that removably couples with the block, a resilient ground beam configured to commonly ground the ground probes, and a signal contact that is configured to connect to the first probe; and
    an impedance controlled block portion defined by the first probe being electrically isolated from the conductive block by an insulator that is inserted into the aperture, and the connector comprises an impedance controlled connector that is inserted partway into the aperture from the cable side of the conductive block; wherein impedance of the impedance controlled connector is substantially matched to the impedance of the impedance controlled block portion.

11. The probe block assembly of claim 10, wherein the first probe comprises one of a signal probe, a power probe, and a utility probe.

12. The probe block assembly of claim 10, wherein the block comprises an electrically conductive block portion that is mated to an electrically insulating block portion, the shield body comprising a latch extending from an exterior surface of the shield body that is removably coupleable to the insulating block portion and the resilient ground beam extending from an exterior surface of the shield body and configured to contact the conductive block portion.

13. A probe block assembly comprising:
a conductive block portion defining an aperture, an insulator inserted into the aperture, a first probe inserted in the insulator and retained within the aperture, and ground probes coupled to the conductive block portion;
an insulative block portion coupled to the conductive block portion such that a channel extending through the insulative block portion aligns with the aperture and the insulator inserted into the aperture; and
a shielded coaxial connector insertable into the channel and configured to removably couple with the insulative block portion and electrically connect with the first probe, the shielded coaxial connector comprising a resilient ground beam that is configured to commonly ground the ground probes.

14. The probe block assembly of claim 13, wherein the first probe comprises one of a signal probe, a power probe, and a utility probe.

15. The probe block assembly of claim 13, wherein the conductive block portion comprises an impedance controlled block portion, and the shielded coaxial connector comprises an impedance controlled connector having an impedance that substantially matches an impedance of the impedance controlled block portion.

16. The probe block assembly of claim 13, wherein the resilient ground beam commonly grounds the ground probes by contacting one of the conductive block portion, one of the ground probes, and a receptacle press-fit into the conductive block and sized to receive one of the ground probes.

17. The probe block assembly of claim 13, comprising a plurality of shielded coaxial connectors, and a mating side of the conductive block portion comprises a plurality of spaced apart metal plates such that the resilient ground beam of each of the shielded coaxial connectors contacts at least one of the spaced apart metal plates to commonly ground the ground probes.

18. The probe block assembly of claim 17, wherein each shield body comprises a pair of opposing resilient ground beams extending from exterior surfaces of the shield body, the opposing resilient ground beams configured to bridge between and contact two of the spaced apart metal plates.

* * * * *